(12) United States Patent
Tsironis

(10) Patent No.: US 9,716,483 B1
(45) Date of Patent: Jul. 25, 2017

(54) WIDEBAND SLIDE SCREW IMPEDANCE TUNER

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 14/974,072

(22) Filed: Dec. 18, 2015

Related U.S. Application Data

(60) Provisional application No. 62/094,559, filed on Dec. 19, 2014.

(51) Int. Cl.
*H03H 7/38* (2006.01)
*H03H 7/40* (2006.01)

(52) U.S. Cl.
CPC ............... *H03H 7/38* (2013.01); *H03H 7/40* (2013.01)

(58) Field of Classification Search
CPC .................................. H03H 7/40; H03H 7/38
USPC .................... 333/263, 17.3, 32, 33
See application file for complete search history.

(56) References Cited

U.S. PATENT DOCUMENTS

| | | |
|---|---|---|
| 6,674,293 B1 | 1/2004 | Tsironis |
| 8,212,629 B1 | 7/2012 | Tsironis |
| 8,410,862 B1 | 4/2013 | Tsironis |
| 9,541,592 B1 * | 1/2017 | Tsironis ................ G01R 29/26 |

OTHER PUBLICATIONS

Datasheet of tuner model iCCMT-5080, Focus Microwaves Inc., Apr. 2013.
Datasheet for 2.4mm connector, SRI Connector Gage Company, Dec. 2014.

* cited by examiner

*Primary Examiner* — Stephen E Jones

(57) ABSTRACT

Multi octave frequency-range electro-mechanical impedance tuners cover frequencies from the megahertz (FM range) to the high (millimeter-wave) gigahertz range, by combining a high frequency with one or two low frequency slide screw tuner modules. Special configurations allow for compact size. The low frequency module can be bypassed using SPDT remotely controlled millimeter wave switches. Appropriate calibration, control and tuning procedures allow for a fully integrated operation.

7 Claims, 21 Drawing Sheets

FIG. 5a)
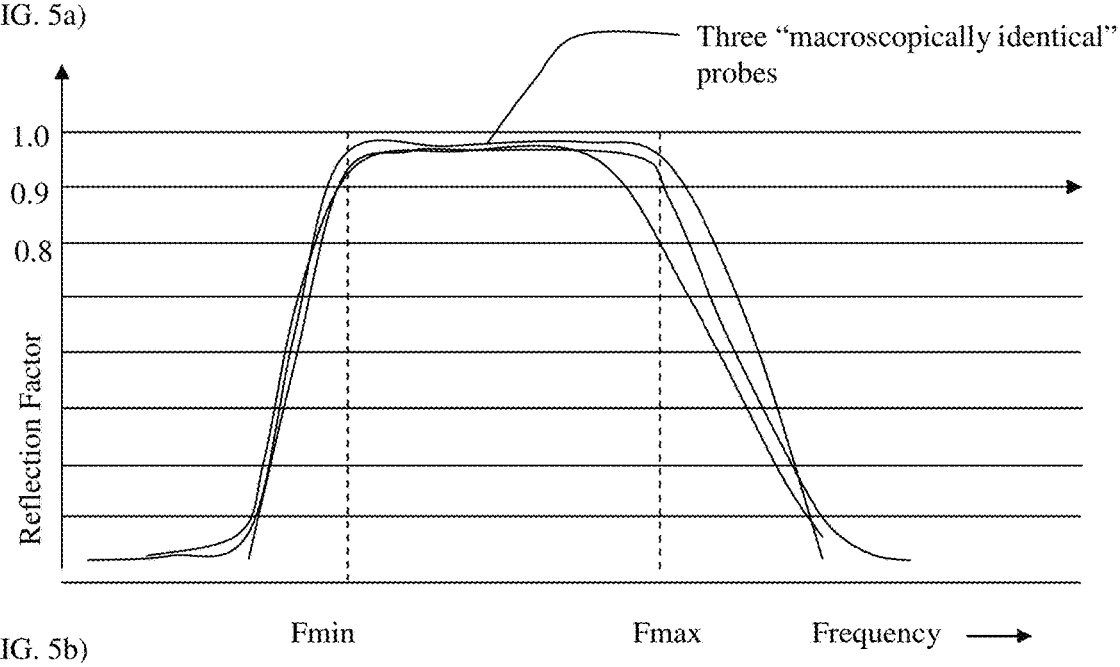
FIG. 5b)
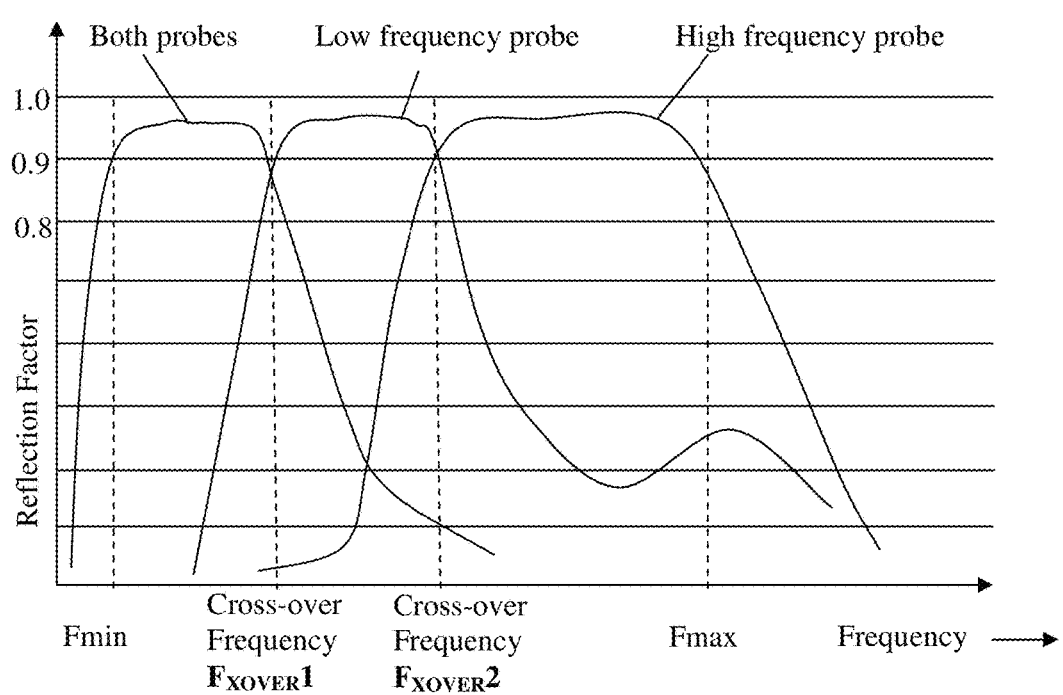
FIG.5 prior art

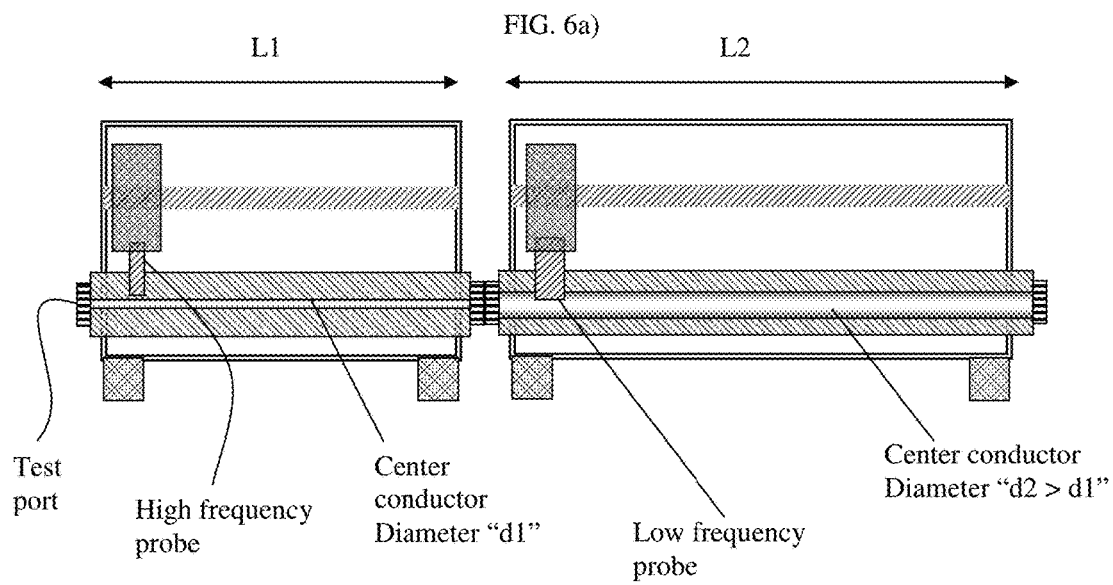
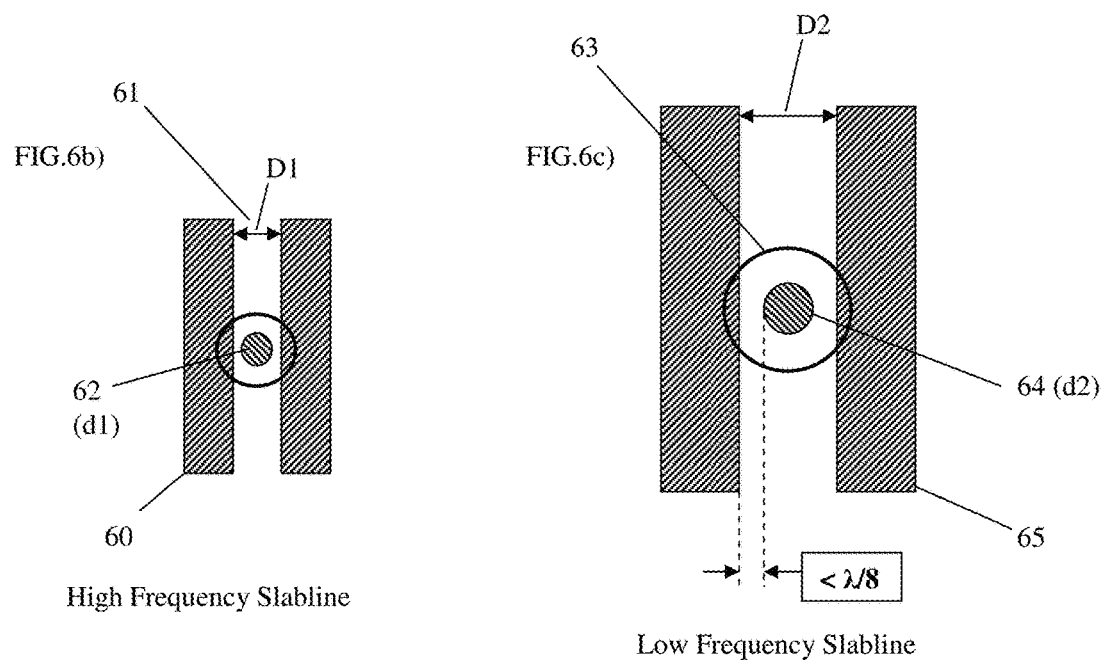
FIG. 6 prior art

FIG. 16 Cross section (150)

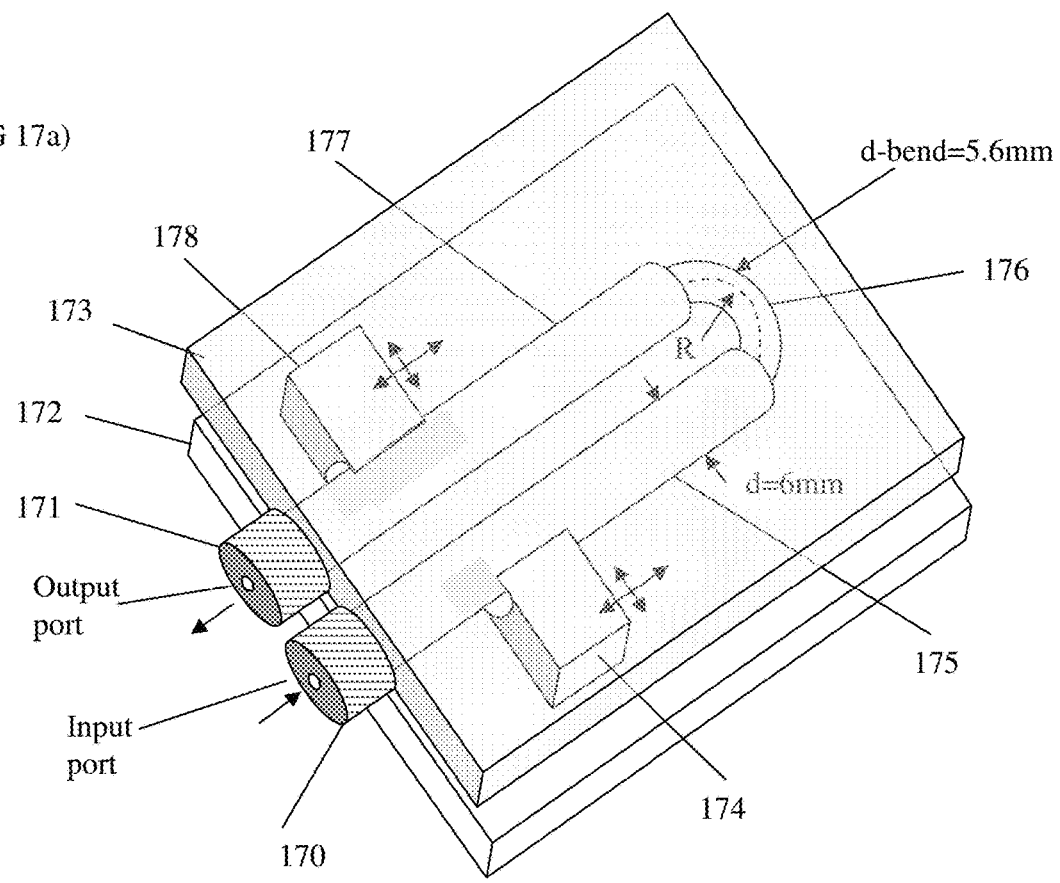
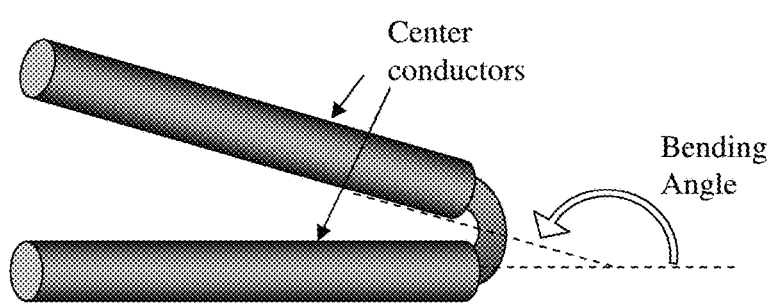
FIG. 17

FIG. 19 compare with FIG. 13

WIDEBAND SLIDE SCREW IMPEDANCE TUNER

PRIORITY CLAIM

This application claims priority on provisional application No. 62/094,559, titled "Wideband Slide Screw Impedance Tuner", filed on Dec. 19, 2014.

CROSS-REFERENCE TO RELATED ARTICLES

1. "Computer Controlled Microwave Tuner, CCMT", Product Note 41, Focus Microwaves Inc., January 1998.
2. Datasheet of tuner model iCCMT-5080, Focus Microwaves Inc., April 2013.
3. Tsironis, U.S. Pat. No. 6,674,293, "Adaptable Pre-matched tuner system and method".
4. Datasheet for 2.4 mm connector, SRI Connector Gage Company, December 2014.
5. "SPDT Absorptive Electromechanical Switch, DC-50 GHz", datasheet, RF-Lambda.
6. Tsironis, U.S. Pat. No. 8,212,629, "Wideband low frequency impedance tuner".
7. Tsironis, U.S. Pat. No. 8,410,862, "Compact multiple range impedance tuner", FIG. 4.

BACKGROUND OF THE INVENTION

This invention relates to testing of microwave transistors (DUT) using automatic microwave impedance tuners used in order to synthesize known reflection factors (or impedances) at the input and output of the transistors.

A popular method for testing and characterizing microwave components (transistors) for low noise and high power operation is "source pull" and "load pull". Load pull or source pull are measurement techniques employing microwave tuners and other microwave test equipment, such as noise receivers, mixers, low noise and power amplifiers, signal sources, power meters and directional couplers (FIG. 1). The microwave tuners in particular are used in order to manipulate the microwave impedance conditions under which the Device under Test (DUT, or transistor) is tested (FIG. 1). Pre-calibrated automatic tuners allow associating the reflection factors ($\Gamma$) with DUT performance (Gain, Power, Noise Figure . . . ) and enable circuit designers optimizing the matching networks for the DUT.

Many applications require impedance tuners to cover a very large (wideband) frequency range. In laboratory environment, in particular, test setups are expensive and applications may vary from the megahertz (MHz) frequency range to 50 or 100 gigahertz (GHz). A slide screw tuner (see ref. 1) being able to operate over such wide frequency ranges would then be required, but has not been known. In all cases, changing the frequency range of operation requires the (cumbersome) tuners to be swapped with tuners covering adjacent frequency ranges in order to cover the whole frequency band.

DESCRIPTION OF PRIOR ART

A slide-screw electro-mechanical tuner, uses adjustable reflective (metallic) RF probes (slugs) which are inserted into the transmission media of the tuners and are capacitively coupled with the central conductor (FIG. 2) of the transmission media which is, in general, a slotted coaxial or parallel plate airline (slabline); this insertion of the slug reflects part of the power coming out of the DUT and creates a reflection factor ($\Gamma$) or impedance (Z) that is presented to the DUT. The relation between reflection factor and impedance is: $Z=Zo*(1+\Gamma)/(1-\Gamma)$; with Zo=characteristic impedance of the transmission line (typically=50$\Omega$), {eq. 1}. In terms of complex admittance Y, the above relation becomes: $Y=1/Z=Yo*(1-\Gamma)/(1+\Gamma)$; with Yo=characteristic admittance (typically Yo=1/50$\Omega$=20 mS) of the same transmission line, {eq. 2}.

The capacitive coupling between the metallic RF probe (reflective probe) and the central conductor of the slotted airline (slabline) (FIG. 2), creates a wideband reflection factor $\Gamma$ of which the amplitude can be adjusted by approaching, or withdrawing, the probe to, or from, the center conductor and thus modifying the gap "S" between the probe and the center conductor and therefore changing the value of the capacitance between the center conductor and the probe. In order to change the phase $\Phi$ of the reflection factor $\Gamma$ ($\Gamma=|\Gamma|*exp(j\Phi)$) the probe, already inserted in the slabline, is moved horizontally along the axis of the slabline.

The combination of both horizontal and vertical movements of the microwave probe inside the slabline allows for the creation of complex reflection factors $\Gamma$ covering the entire impedance space or Smith Chart (FIG. 3). Starting at point "a", which corresponds to no reflection at all (Z=50$\Omega$), one approaches the probe to the central conductor, thus creating a reflection, and reaches point "b". Then one moves the probe horizontally and turns on a circle of constant radius on the Smith Chart and reaches point "c". This technique allows synthesizing any reflection factor on the Smith Chart, within the tuning range, which corresponds to maximum reflection factor |$\Gamma$| or Voltage Standing Wave Ratio: VSWR of the tuner, whereby $VSWR_{max}=(1+|\Gamma_{max}|)/(1-|\Gamma_{max}|)$, {eq. 3}.

By its nature a metallic probe (slug) inside a low loss slotted airline (slabline) creates high reflection but has a limited frequency range. The probe has a capacitive effect but does not behave purely as a capacitor, because it also creates a complex electro-magnetic field deformation. Typical bandwidths covered by a single metallic probe are equal or less than 2-3 octaves (1 octave=$F_{max}/F_{min}$=2), whereby $F_{max}$ is the maximum and $F_{min}$ the minimum frequency at which the probe creates high reflection (see FIG. 5a). If we want to cover several octaves using the same tuner we need two or three probes of different size (the larger the probe, the lower the minimum frequency and vice versa) operating in parallel. This allows a maximum to minimum frequency range of up to 6:1 or up to 18:1, such as 8 GHz to 50 GHz or 2 to 36 GHz (FIGS. 4 and 5b). Electro-mechanical GHz range impedance tuners offer the highest instantaneous bandwidth and lowest insertion loss possible of all tuner types, but are still, even when using two or three parallel probes, by their nature, limited in frequency bandwidth to 3 or 4 octaves (8-50 GHz, or 2-32 GHz, see ref. 2). Therefore new methods are needed to increase the instantaneous bandwidth.

To increase the instantaneous bandwidth an extended structure employs two or three RF probes different in size, in parallel (FIG. 4), each probe covering a different, at best adjacent frequency range (see ref. 3 and ref. 7). As an example such a tuner would be able to cover a frequency range of 0.4 to 18 GHz ($F_{max}/F_{min}$=45:1) or 1 to 50 GHz, a ratio of 50:1, however a tuner operating down to 300 MHz and up to 50 GHz faces major mechanical and electromagnetic propagation problems: these are: 1) the slabline in adjacent frequency bands 0.3 to 2 GHz and 2 to 50 GHz cannot be the same, because the diameter of the center conductor of the high end tuner (50 GHz) is too small to allow enough capacitive coupling to generate high reflection; 2) the length of the center conductor at 0.3 GHz is so large that a thin rod, capable to operate also at 50 GHz would not be stable enough.

In ref. 7 the probes are not immediately adjacent; as a consequence the advantage of using probe 1, probe 2 and probes 1 plus 2 jointly to cover three adjacent frequency bands using only two probes is not possible. If there is a gap between probes (see FIG. 4) and both probes are inserted simultaneously into the slabline disturbing multiple resonances, in form of reflection factor ripple, will occur and the frequency band cannot be covered continuously.

Therefore the ultimate limits in bandwidth are 1) mechanical stability of the central conductor of the slotted airline (slabline) and 2) slabline cut-off frequency. The mechanical stability of any unsupported metallic (steel) rod depends on its slenderness (ratio of total length to diameter). If this ratio exceeds 100:1 then the structure is critical. In the present case, a wideband tuner starting at 0.4 GHz and going through to 18 GHz needs a central conductor with a diameter of 3 mm and a total length of 530 mm; this makes the slenderness ratio Length/Diameter=176:1. It is therefore very important not to ignore practical considerations in such an apparatus, such as means to support and stabilize the center conductor, without interfering with the movement of the probes.

On the other hand, the electromagnetic wave propagation in a slabline has cut-off frequencies, i.e. frequencies above which energy (wave) propagation along the axis of the slabline is impossible. The exact electromagnetic field propagation calculations are complex, but as a rule of thumb, it can be said that there will be a spurious transmission mode at a cut-off frequency $F_{co}$ when the shortest "metal-to-metal" distance exceeds $\lambda/8$ (see FIGS. 6b and 6c), in which case spurious (traversal) propagation modes are excited, which disrupt continuous signal propagation. Approximately it can be said: Fco[GHz]≈75/(D−d)[cm] {eq. 4}. Beyond cut-off the slabline presents uncontrollable residual reflections and tuning is impossible (FIG. 7). The circle (63) in FIG. 6c) indicates the contour of the inside wall of the coaxial connector associated with the slabline having the same propagation characteristic impedance Zo (typically 50 Ohm); this means the coaxial connector will have a lower cutoff frequency $F_{co}$ than the slabline metal-to-metal distance in coaxial transmission is larger than in slabline transmission).

Slide screw tuners require a total horizontal travel length of ½ wavelength to cover 360 degrees of phase rotation of Γ. At 1 GHz this corresponds to 15 cm, at 100 MHz to 150 cm. It is obvious that at frequencies below a few hundred megahertz the mechanical size (length) of a slide screw tuner is prohibitive. Also impossible is it to operate above cut-off frequency ($F_{co}$). In the case of FIG. 6c) for instance, where the center conductor has a diameter of 6 mm and the channel of the slabline is 10.83 mm wide, the gap at the shortest distance metal-to-metal is d=2.41 mm, which corresponds to a cut-off frequency of 15.5 GHz. The bandwidth limitation is therefore twofold: 1) towards low frequencies, because of mechanical limitations/center conductor instability (slabline length); and 2) at high frequencies, because of parasitic (traversal) propagation modes.

BRIEF DESCRIPTION OF THE SEVERAL VIEWS OF THE DRAWINGS

The invention and its mode of operation will be more clearly understood from the following detailed description when read with the appended drawings in which:

FIG. 5 depicts prior art, various probe configurations a) maximum reflection of three macroscopically identical probes and b) maximum reflection of three different (one high frequency, one medium and one low frequency) probes; all probes are inserted in the same slabline.

FIGS. 6a) to 6c) depict prior art, FIG. 6a) depicts a cascade of two slide screw tuners using a low and a high frequency probe; FIG. 6b) depicts the cross section of a high frequency slabline; FIG. 6c) depicts a cross section of a low frequency slabline.

FIGS. 17a) and b) depict, 17a) depicts a view of U form slabline bend; 17b) depicts definition of bending angle between center conductors of the "U" shaped slabline.

DETAILED DESCRIPTION OF THE INVENTION

This invention describes a large band slide screw microwave impedance tuner apparati which cover instantaneously a very large frequency bandwidth of up to 7 or 8 octaves (0.1 or 0.3 GHz to 50 GHz). Such an endeavor has never been disclosed before in a coaxial slide screw tuner structure. In fact it becomes possible, when appropriate technologies are used and are combined with associated tuning techniques, which allow the tuner modules in cascade to compensate for each-other's residual reflections. In order to understand this operation we need to review the residual reflections of the low frequency tuners at high frequencies (FIGS. 7 to 10). Also in order to avoid intrinsic reflections due to the coaxial RF connectors, which have upper frequency limits (cut-off frequencies) all tuners and RF switches in the cascade must be equipped with connectors which allow signal flow at the highest frequency; for instance, if the highest frequency is 50 GHz only 2.4 mm connectors can be used (see ref. 4). Beyond the connector's residual reflection (which can be eliminated by selecting the proper connector type) internal residual reflections occur, due to the slabline dimensions of the low frequency tuners, which can be bypassed, to avoid blocking the signal flow, only through special designs, using appropriate circuitry and tuning algorithms.

Figure 12:
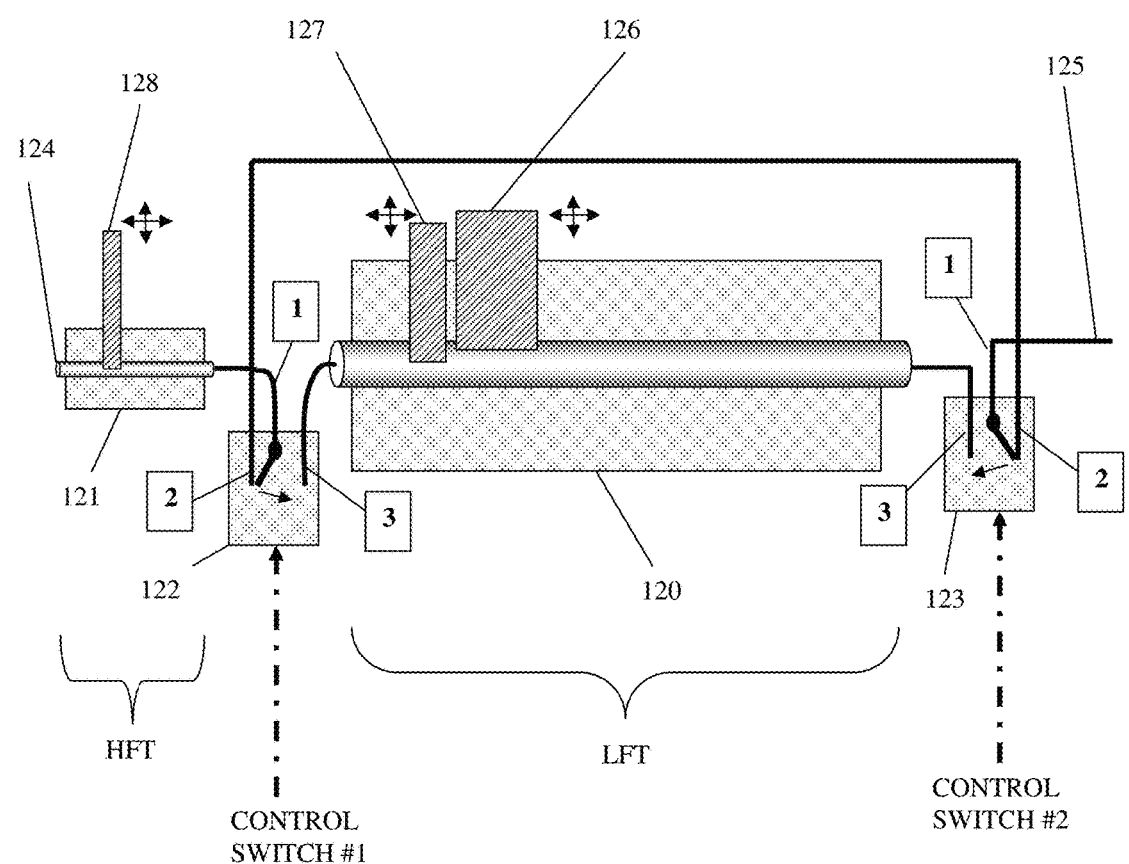
FIG. 12 depicts wideband slide screw tuner using a cascade of high frequency tuner module (HFT) and low frequency tuner module (LFT) switchable using remotely controlled RF bypass SPDT switches.

One possible extension of frequency band uses tuners covering different frequency bands and consists in cascading two such tuner modules (FIG. 6); the tuners may cover adjacent but also non-adjacent frequency bands. The purpose of such a configuration is to use a once assembled test setup for a wide frequency range without swapping tuners or recalibrating all the components and the tuners separately. However, if the lowest frequency is a few hundred MHz (example Fmin=300 MHz) and the highest frequency in the millimeter frequency range (example Fmax=50 GHz), as shown in FIG. 12, the low frequency tuner module (120) must be at least 50 cm long, allowing for a free travel of $\lambda/2$ ($\lambda$(300 MHz)=100 cm), to which the carriages for low (126) and high (127) frequency probes and side-walls must be added, making it at least 60 cm long; to which the length of the high frequency tuner (121) with probe (128) and associated adapters and switches (122), (123) must be added, making the unit almost as long as 1 meter between the input (124) and output (125) ports.

Figure 13:
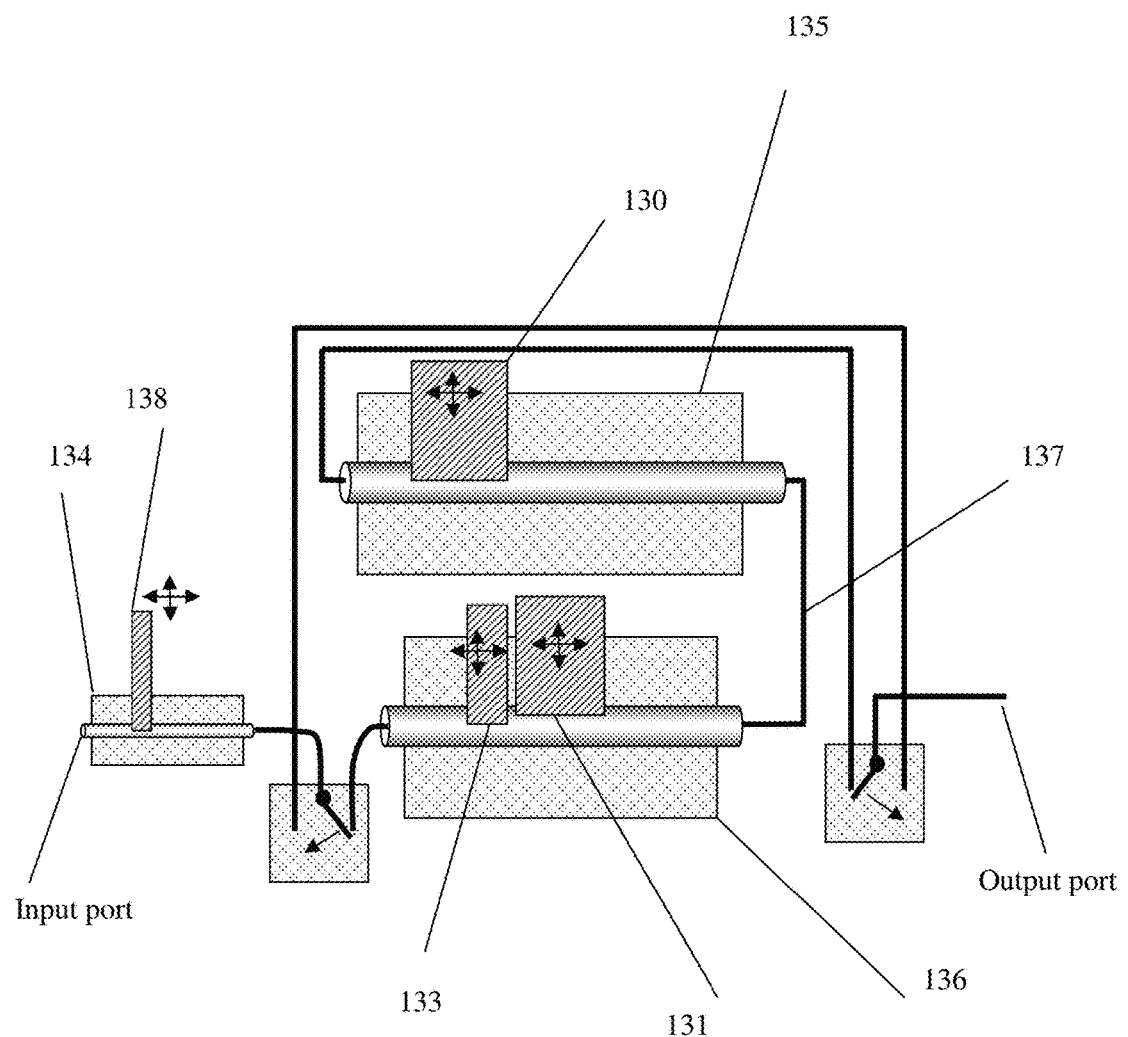
FIG. 13 depicts wideband slide screw tuner using switchable cascade of two different slabline structures, RF bypass switches, whereby the low frequency tuner is constructed in parallel form using slabline sections connected using low loss cable, in order to reduce the linear length.
Figure 14:
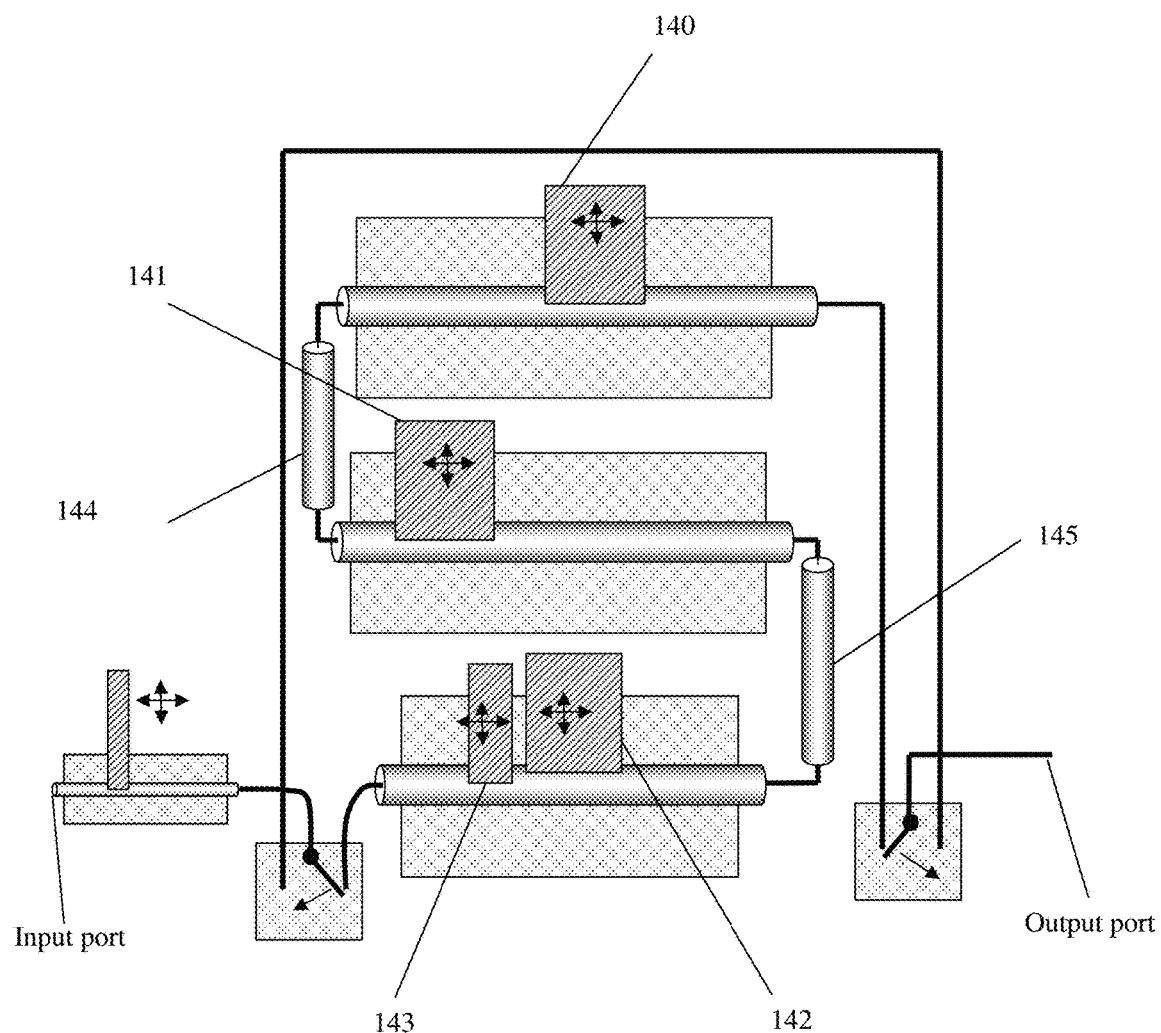
FIG. 14 depicts wideband slide screw tuner using switchable cascade of two different slabline structures using RF bypass switches of which the low frequency tuner is constructed in "S" form using low loss coaxial transitions between branches.
Figure 15:
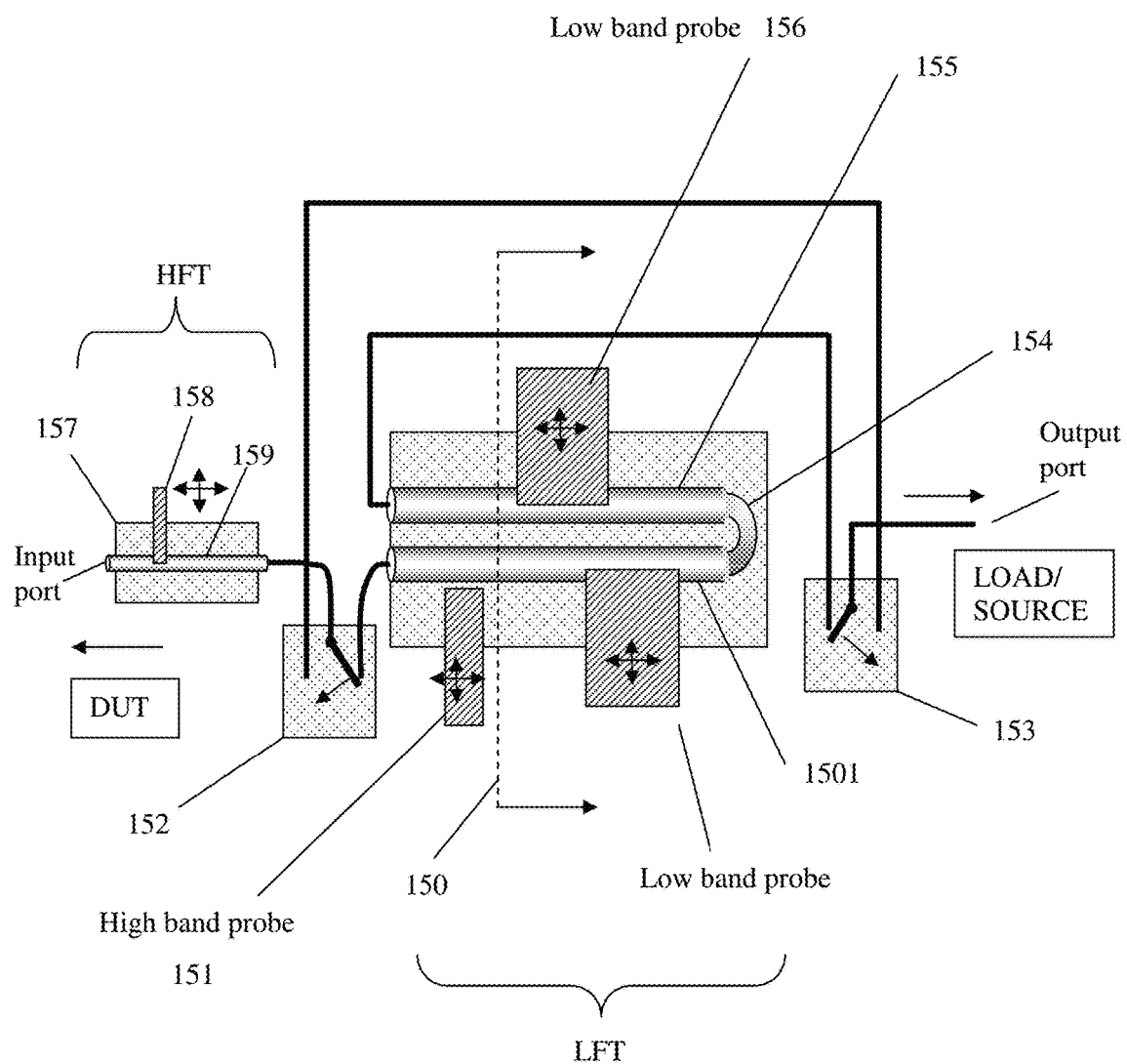
FIG. 15 depicts wideband slide screw tuner using switchable cascade of two different slabline structures using RF bypass switches, whereby the low frequency tuner is constructed in "U" form using low loss slabline bend (see FIG. 17).

The requirement is though to reduce the overall length of the wideband tuner as much as possible, still keeping acceptable performance. To do so, the low frequency tuner module cannot be made linear: alternatives include a "U" form folded structure as shown in FIG. 13, and an "S" form as shown in FIG. 14 or an integrated U form as shown in FIG. 15; the advantages and shortcomings of these structures will be discussed in detail below.

As already mentioned the linear configuration of the low frequency tuner (LFT) is to be replaced by a shorter one in "U" (FIGS. 13, 15) or "S" (FIG. 14) shape. All alternative configurations, however, will include the same basic components: a high frequency tuner (HFT), (121) which comprises one or two reflective probes (128) and a slabline (124), (60) of such dimensions, channel width "D1" (61) and center conductor diameter "d1" (62) allowing signal propagation up to a maximum frequency, in our example 50 GHz (see also FIG. 6b). For this type of transmission the commercially available 2.4 mm connector is used (see ref. 4). The cut-off frequency $F_{co}$ of this connector is >50 GHz. The high frequency tuner (121) is cascaded with the low frequency tuner (120) using a single pole double throw (SPDT) switch (122), see ref. 5. Both SPDT switches (122) and (123) have 2.4 mm coaxial connectors to support frequencies up to 50 GHz. The switches allow bypassing the low frequency tuner (120) for frequencies above its cut-off frequency $F_{co}$.LFT (see FIGS. 8 and 10), because, whereas the high frequency tuner (HFT) will allow the low frequency to pass through undisturbed, the residual reflection (100) of the low frequency tuner (LFT) will incapacitate proper high frequency tuning.

Reflective (metallic or plastic coated with metal) probes used in slide screw tuners have limited bandwidth, each probe having a lowest and a highest frequency of operation, thus creating the operational bandwidth of each probe, which is smaller than the operational bandwidth of the slabline (see FIG. 5). This is equally valid for the high frequency tuner module (HFT) as for the low frequency tuner module (LFT). In all tuner structures proposed (FIGS. 12 to 15) at least the low frequency tuner module (LFT) is shown to comprise at least two probes, one probe for the high frequency band (127) and one probe for the low frequency band (126). This is valid for the high frequency module (HFT) as well. In the case of the "U"- or "S"-formed slablines (FIGS. 13 to 15) the low frequency band probes are duplicated (130) and (131) or triplicated (140), (141) and (142), whereas the high frequency band probes (133) and (143) are typically required only once. Double probes can also be used for the high frequency tuner, again one for the upper band and one for the lower band. In the case of a 8-50 GHz high frequency tuner, for instance, one probe may cover the whole band, or one may cover 8-16 GHz and the other 16-50 GHz. It seems obvious that tuner alignment for maximum frequency coverage is easier when multiple probes are used, because the frequency band can be segmented, but the overall mechanical complexity, electronics etc. become higher. Multiple probes are absolutely necessary only if a single probe cannot create the required maximum reflection over the whole frequency band.

In the context of this invention a cross-over frequency ($F_{XOVER}$) is the frequency at which one reflective probe stops generating enough reflection when fully inserted into the slabline and another (higher frequency one) probe has to be used (FIG. 5). A cut-off frequency ($F_{co}$) is the highest frequency of propagation in a transmission line; it is related to the transmission behavior of connectors and transmission lines (FIGS. 6b) and 6c)). Cut-off occurs when the predominant transmission mode is replaced by or mixed with traversal propagation modes. This happens when the transmission line equations find appropriate boundary conditions to allow electromagnetic waves to propagate perpendicularly, in which case the energy does not follow the center conductor of the airline from input to output and high residual reflection occurs; as a rule of thumb this happens when the closest distance between metallic (conductive) surfaces is approximately one eighth of the wavelength ($\lambda/8$) or larger.

Figure 9:
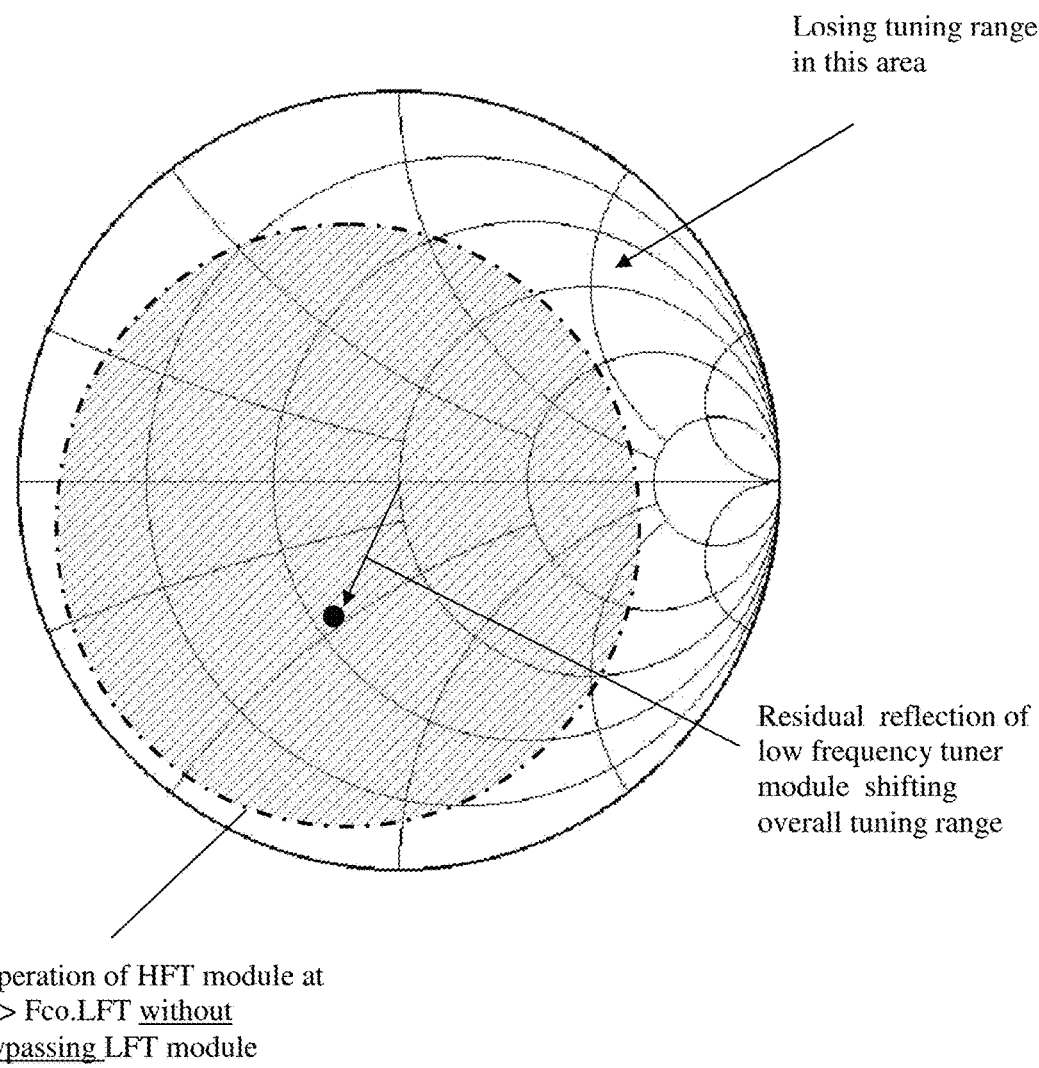
FIG. 9 depicts the undesired shifting of the tuning range due to residual reflection during an operation at a frequency above cut-off frequency.
Figure 10:
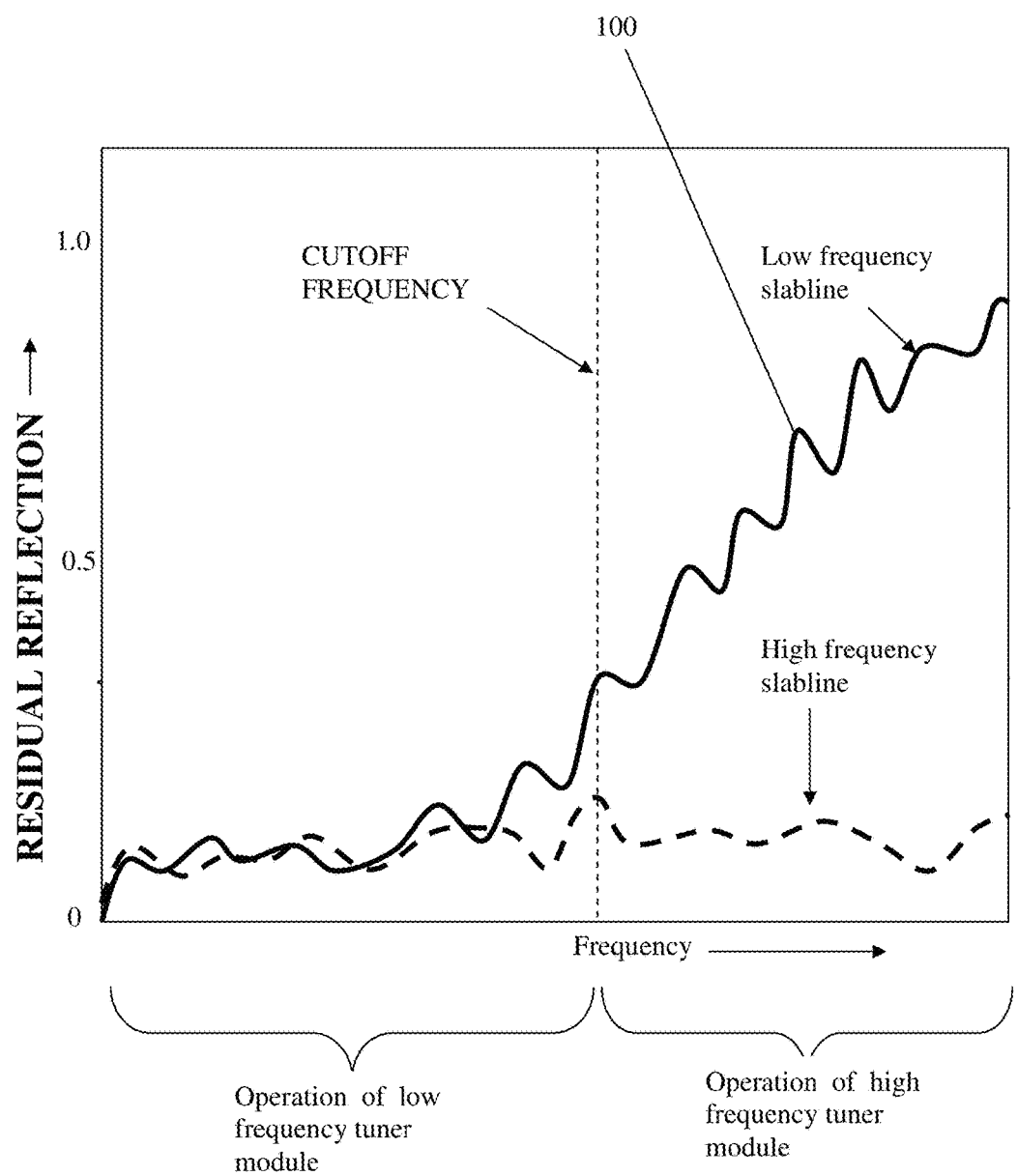
FIG. 10 depicts the residual reflection factor of a low frequency slabline (continuous trace) versus a high frequency slabline (dotted trace).

The reason why the low frequency tuner module must be bypassed when the high frequency tuner module is operating above the cut-off frequency of the slabline of the low frequency tuner ($F_{co}$.LFT), is (a) because the residual reflections (Γ-residual) of the low frequency module LFT (FIG. 7) will de-tune the reflection factor Γ-test of the high frequency tuner at the test port and reduce the tuning capacity in certain area of the Smith chart; and (b) because it will block the signal transmission through its slabline; the de-tuning effect is shown in FIG. 9, if one attempts tuning using the high frequency module (HFT) at a frequency above the cut-off frequency $F_{co}$.LFT of the low frequency module (LFT), without bypassing it using the SPDT switches; this is shown by the following equation (S11, S12, S21, S22 are S-parameters of the high frequency tuner module); the overall reflection factor available at the input port (124) of the overall large band tuner is:

$$\Gamma\text{-test}=S11+(S12*S21*\Gamma\text{-residual})/(1-S22*\Gamma\text{-residual}) \quad \{\text{eq. 5}\}$$

Figure 20:
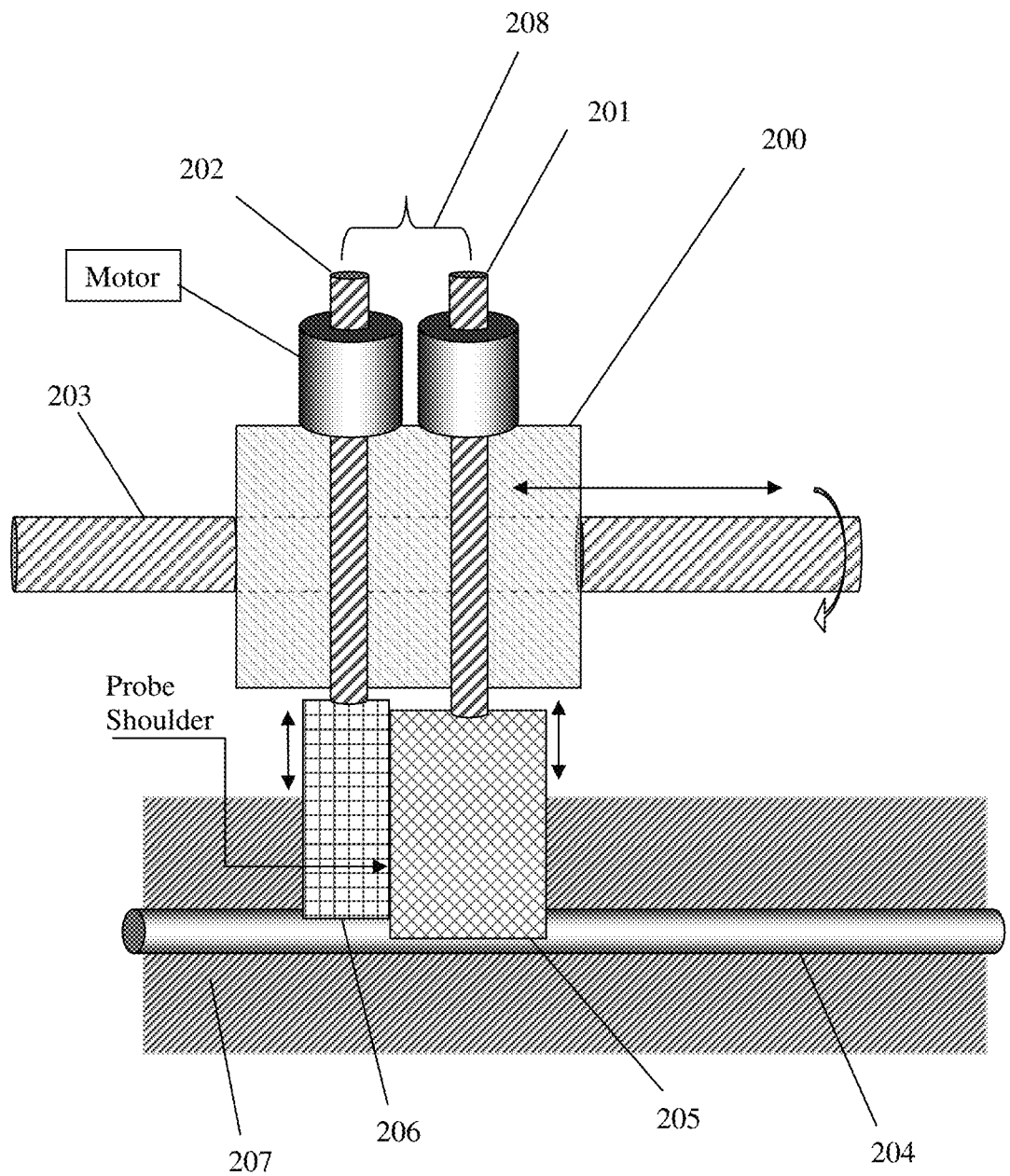
FIG. 20 depicts two adjacent reflective probes in the same tuner carriage moving simultaneously vertically allowing seamless coverage of large frequency range from low to high frequencies in three overlapping bands (see FIG. 20).

In a first embodiment (FIG. 12) the high frequency tuner module (HFT) (121) is cascaded with a linear low frequency tuner module (LFT) (120). The remote SPDT switches (122) and (123) can be set to include the low frequency tuner, for operation at frequencies below cut-off of the LFT ($F_{co}$.LFT), or bypass it and establish a direct connection of the high frequency tuner with the output port (125), for operation frequencies above $F_{co}$.LFT. The low frequency tuner (LFT) has, in this case, two reflective probes (127) and (126); the number of probes required, both for the LFT and the HFT depend on the required bandwidth and maximum reflection; if two (or three) probes are used, then they can be implemented independently: when one probe is inserted, the others can be withdrawn. In a scenario where both probes are immediately adjacent, without a horizontal gap between them, they can be used together to increase the maximum reflection factor by increasing the total capacitance at the lowest frequency of the tuner operation. In this case the horizontal travel length of the low frequency module must allow one half of a wavelength travel on the probe tandem at the specific lowest frequency (FIG. 20). The operation frequency of a probe is defined as the frequency range between a lowest and a highest frequency, when the probe is placed at maximum proximity to the center conductor and generates a required reflection factor; an example is shown in FIG. 5b), whereby the frequency of operation of the Low frequency probe is between $F_{xover}1$ and $F_{xover}2$ and of the High frequency probe between $F_{xover}2$ and Fmax.

In this case (FIG. 20), both probes, the low frequency probe (205) and the high frequency probe (206) are mounted adjacent, without a gap between them, in the same carriage (200), but controlled vertically using two different axes (201) and (202) driven by separated motors (not shown). The carriage is moved horizontally using a lead screw (203) or a timing belt or rack and pinion mechanism. In this special arrangement of FIG. 20, both motors (not shown) are directed to move the probes synchronously vertically. The probes touch sidewise (shoulder-to-shoulder) each-other when moving vertically inside the slabline slot (207), approaching the center conductor (204) simultaneously or individually; if they approach simultaneously (208) this corresponds to trace marked "Both Probes" in FIG. 5b), and trace (210) in FIG. 21; but since the probes are not permanently attached to each-other the operation has three degrees of freedom, covering three adjacent frequency bands: Probes (206) and (205) approaching jointly cover F0 to $F_{xover1}$ (=F1); Probe (205) covers $F_{xover1}$ to $F_{xover2}$ (=F2) and probe (206) covers $F_{xover2}$ to $F_{max}$, whereby Fmax≥$F_{xover2}$≥$F_{xover1}$≥F0; hereby the index "xover" means "crossover"; this is the frequency at which one probe stops creating enough reflection and the next probe takes over. For continuous operation the probe's tuning ranges must overlap or at least they must share crossover frequencies.

Figure 21:
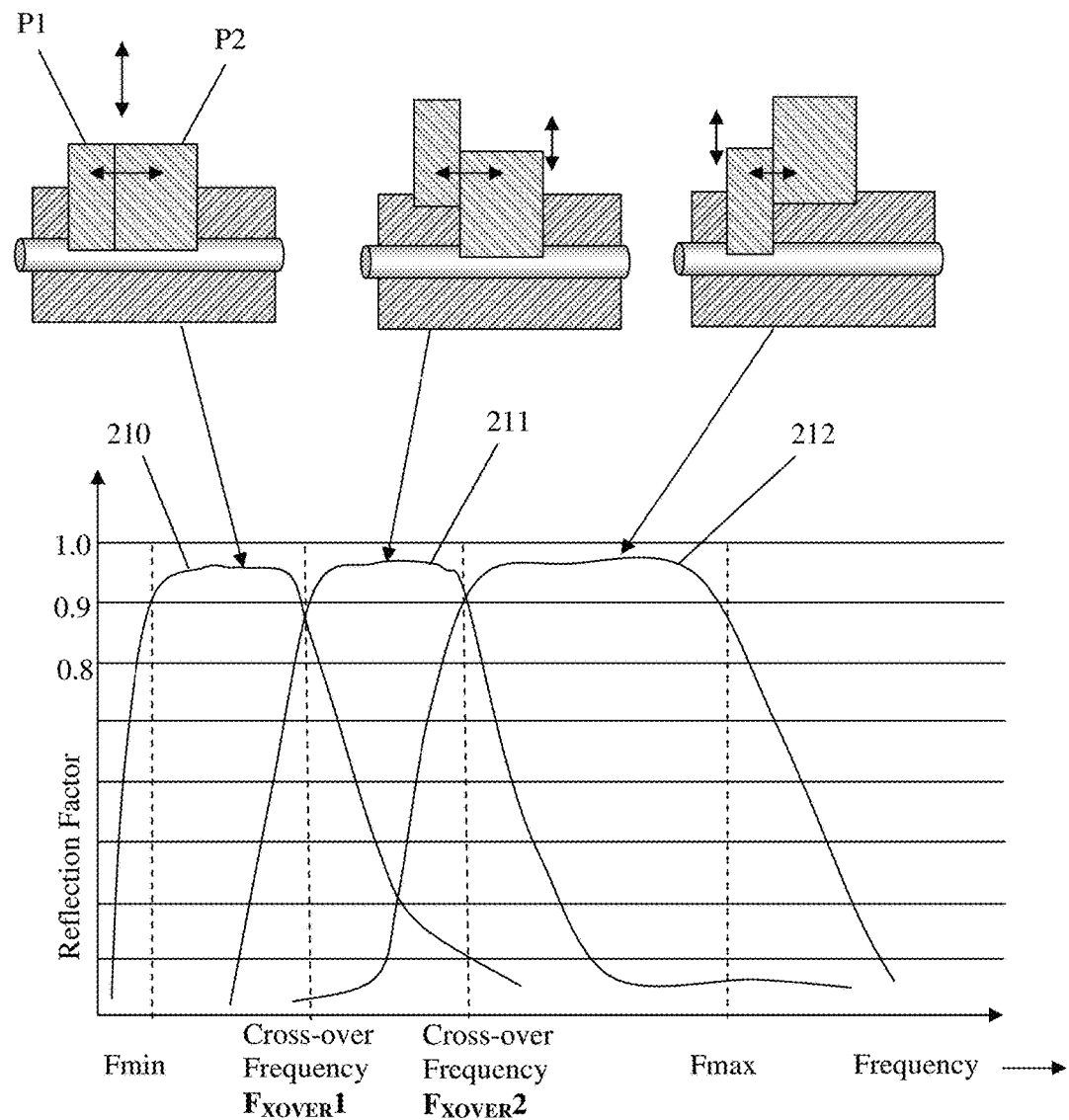
FIG. 21 depicts the three possible tuning arrangements using two adjacent metallic reflective probes in a slabline, as shown in FIG. 19, and the associated adjacent operational frequency bands.

The three possible arrangements for covering three adjacent frequency bands using only two reflective metallic probes in a single slabline are shown in FIG. 21. The maximum reflection trace (210) at the lowest frequency is created when both probes, which slide side by side without leaving a gap between them, approach the center conductor simultaneously. The trace (211) is created when the larger (low frequency) probe P2 approaches alone and probe P1 is withdrawn; and trace (212) is created when the narrower (high frequency) probe P1 approaches alone and probe P2 is withdrawn. The right choice of probe size allows the frequency bands (210), (211) and (212) to be adjacent.

Starting with the lowest possible frequency F0, both probes (205) and (206) are approaching the center conductor jointly and the carriage (200) moves λ0/2 horizontally (λ0 corresponds to F0, etc.). For F>$F_{xover1}$ probe (206) is withdrawn and only probe (205) is used; the carriage (200) moves $\lambda_1/2$. For F>$F_{xover2}$ probe (206) is used and probe (205) is withdrawn. The carriage (200) moves $\lambda_2/2$. For F>$F_{max}$ the RF switches (122) and (123) are toggled and the low frequency module (LFT) is bypassed and probe (128) is used. The HFT module can also be equipped with two probes, the same as the low frequency module. This is not shown because of equivalence.

In a second embodiment (FIG. 13) the high frequency tuner (134) is cascaded with a linear low frequency tuner which comprises two sections: an upper band section (136) and a lower band section (135). The upper frequency band section (136) comprises typically of two reflective probes. One probe (133) operates at the high frequency portion of the band covered by the low frequency tuner. The other probe (131) and its sibling (130) cover the lower frequency band of the frequency range of the low frequency tuner. Probes (131) and (130) may be identical or similar in size. They operate independently: when one is inserted the other is withdrawn from the slabline. As an example consider: total frequency range of low frequency tuner: 0.3-8 GHz; probe (133) covers 3-8 GHz; probes (130) and (131) cover 0.3-3 GHz. Additional requirement is, obviously, that probe (133) can travel horizontally at least one half of a wavelength at the lowest frequency in its band (in this example Fmin=3 GHz, or λ/2=50 mm). The total travel of probes (130) and (131) must be λ/2 at 0.3 GHz equal to 500 mm; splitting the sections (136) and (135) is done considering the carriage width of the combined probes (133) and (131) which is larger than the carriage of a single probe (130).

Figure 16:
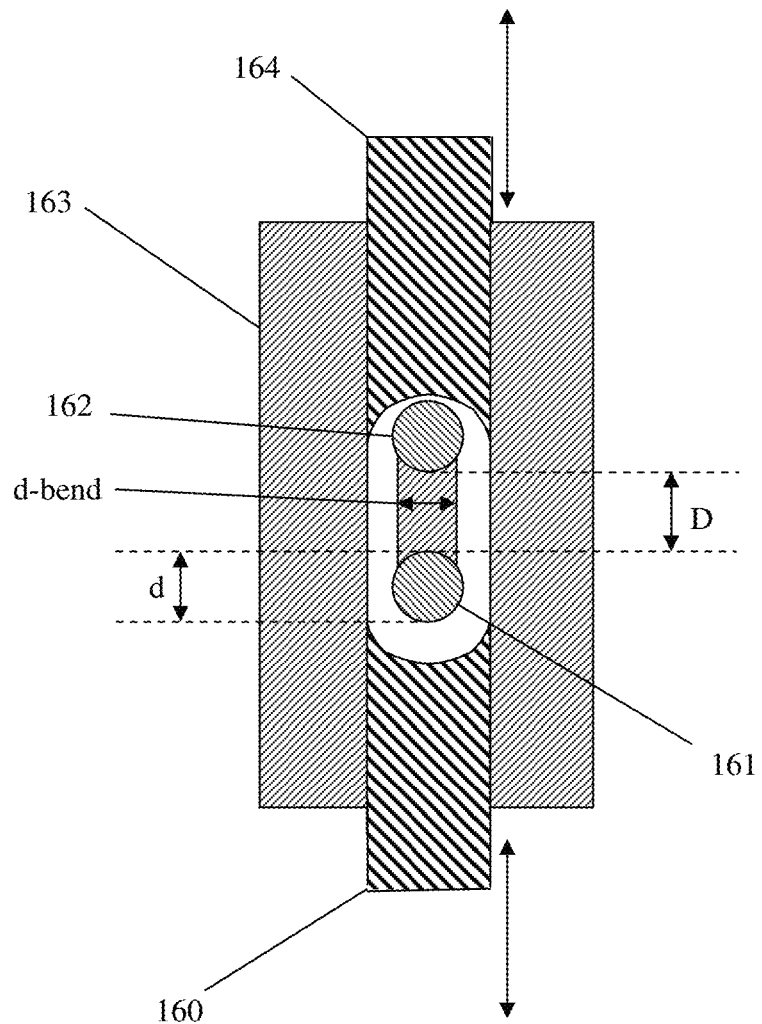
FIG. 16 depicts a cross section (150) of slabline bend including low frequency probes.
Figure 18:
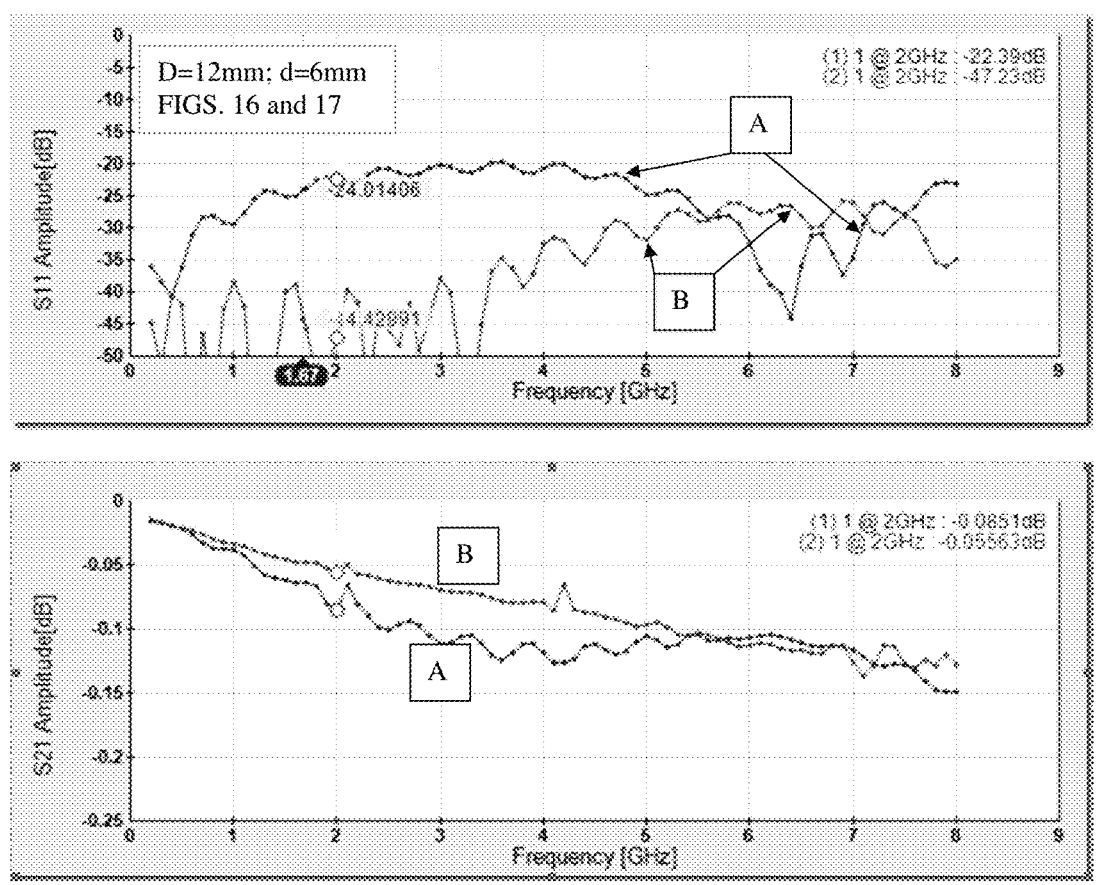
FIG. 18 depicts transmission (S21) and residual reflection (S11) of a matched "U" shaped 180 degree bend slabline: Trace A: non-matched; trace B: matched.
Figure 19:
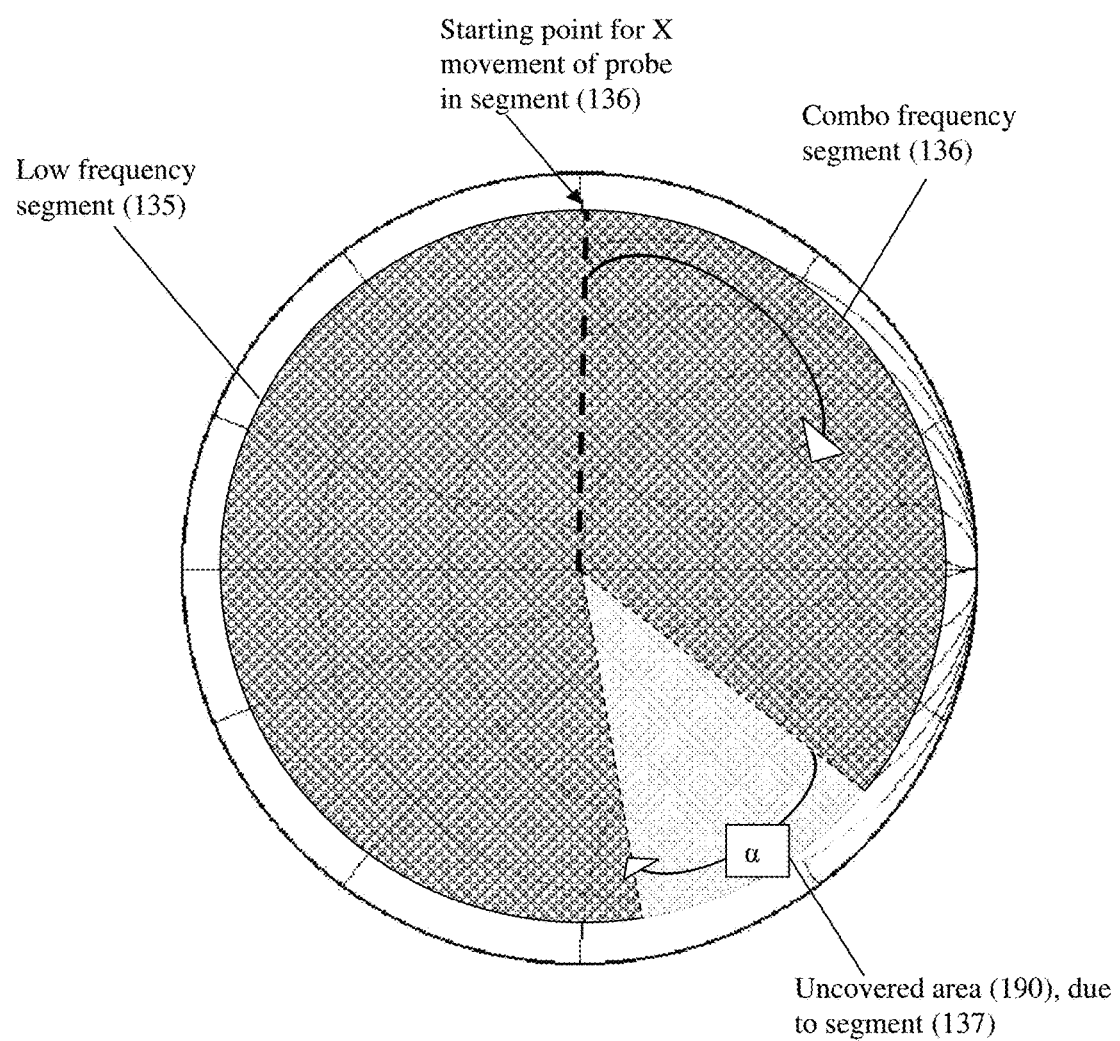
FIG. 19 depicts tuning area of segmented low frequency tuner (per FIGS. 13, 14, 15 and 17), at the lowest frequency of operation.

These considerations depend on the technology and geometries used and it is not deemed necessary to specify them here in detail. The connection between the output of section (136) and the input of section (135) is made using a short RF cable (137). FIG. 19 shows the tuning behavior of low frequency tuner of FIGS. 14 and 15: between the end of the tuning angle of the first segment (136), (1501) and the beginning of tuning angle of the second segment (135), (155) there is a gap (190). Impedances inside this area cannot be reached. The width of this gap increases with increasing frequency, because the angle is proportional to the frequency (F) and the electrical length (L) of the joining section (137), (154): α=4πc*L/λ*F. When the frequency increases and reaches the lowest frequency of the high frequency probe (127), (133), (143), (151), which is the cross-over frequency $F_{XOVER}$, inside the low frequency module (LFT), the high frequency probe takes over and the Smith chart is covered again in full, since this probe can travel one half of a wavelength inside the LFT module. The maximum gap is therefore $\alpha.max = 4\pi c*L/\lambda*F_{XOVER}$. For $F>F_{XOVER}$: $\alpha=0$. To reduce the size of the gap there are two methods: 1) use air as dielectric, since $L=\in_r*L$-phys, whereby L-phys is the physical length of the joining segment and L its electrical length. It is known that the lowest dielectric constant is that of air: $\in_r(air)=1$, and 2) minimize L-phys by bringing the two sections of center conductor (155) and (1501) as close as possible: it has been found experimentally and through simulations that the smallest distance D (FIG. 16) is equal to 2*d, two times the diameter of the center conductor. In the case of d=6 mm this becomes D=12 mm, which is the base of the results shown in FIG. 18. This leads to finding and introducing the smallest Radius "R" possible (FIG. 17). In this case the physical length (L-phys) of the bend is L-phys=$\pi$*R, or for R=9 mm, L-phys=28.4 mm; at F=300 MHz this corresponds to 20.4 degrees tuning gap on the Smith chart and at the cross-over frequency between the high (133) and low (131) frequency probes (see FIG. 5), which in this case is typically $F_{XOVER}$=1 GHz, the width of the uncovered area becomes approximately 60 degrees. For frequencies F>1 GHz the gap becomes 0 again, since the high frequency probe (133) can now travel the full length horizontally of $\lambda/2$ (1 GHz)=150 mm.

In a third embodiment (FIG. 14) the low frequency section of the low frequency tuner is split in three segments forming an "S" and uses triplication of the lowest frequency probes (142), (141) and (140). The transition between segments of the slabline is made using the folding concept of FIG. 15; in this case the cross-over frequency between probes (143) and (142) is between 500 MHz and 700 MHz and there will be two uncovered areas, similar to the one shown in FIG. 19, one for each transition (144) and (145).

Figure 1:
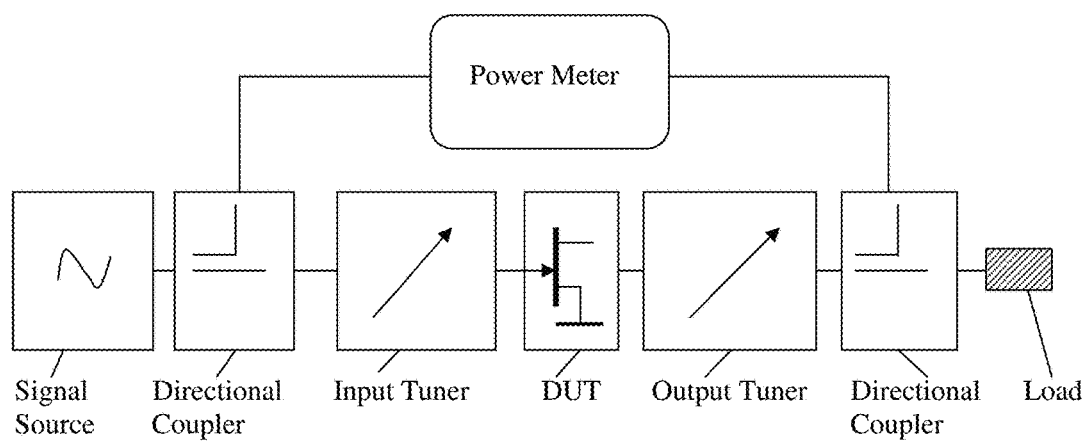
FIG. 1 depicts prior art, typical load pull setup using impedance tuners.
Figure 2:
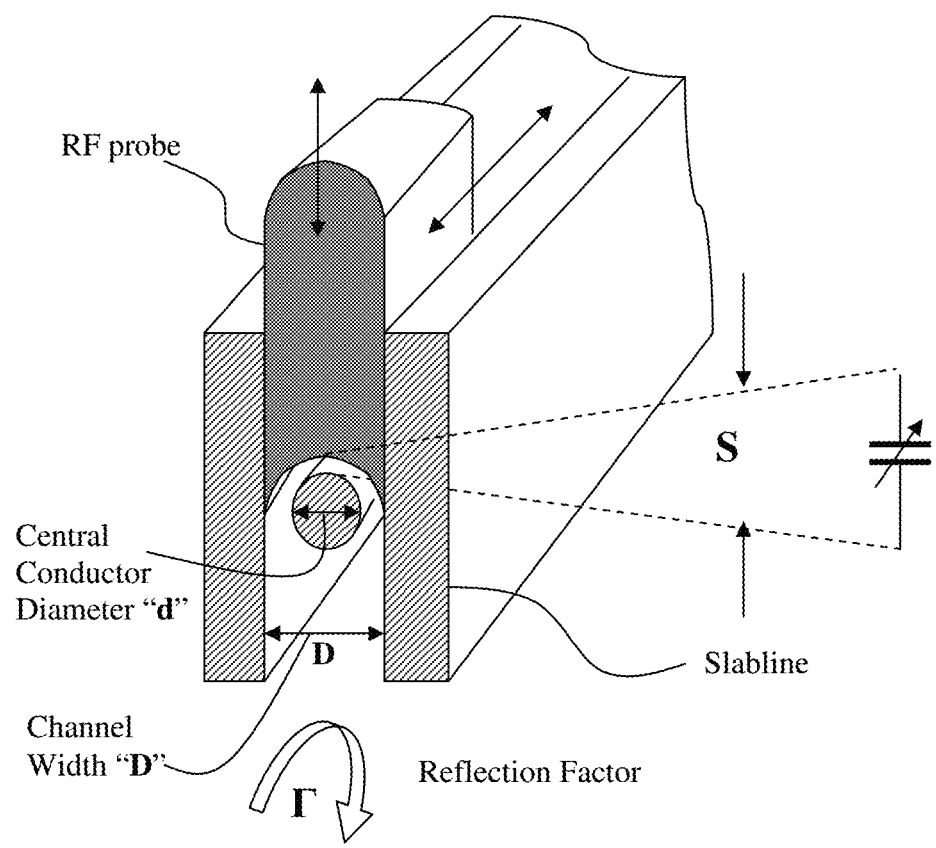
FIG. 2 depicts prior art, cross section of electro-mechanical slide screw tuner.
Figure 3:
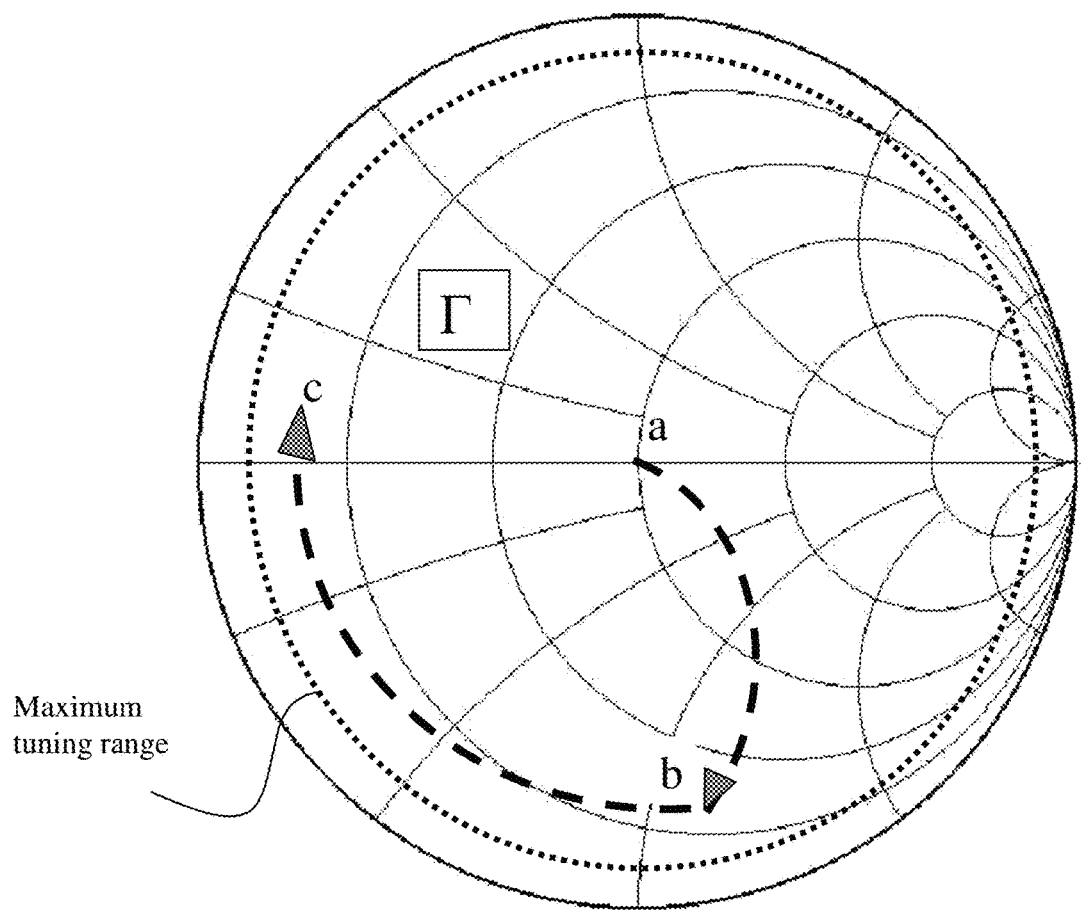
FIG. 3 depicts prior art, tuning mechanism of slide screw tuner.
Figure 4:
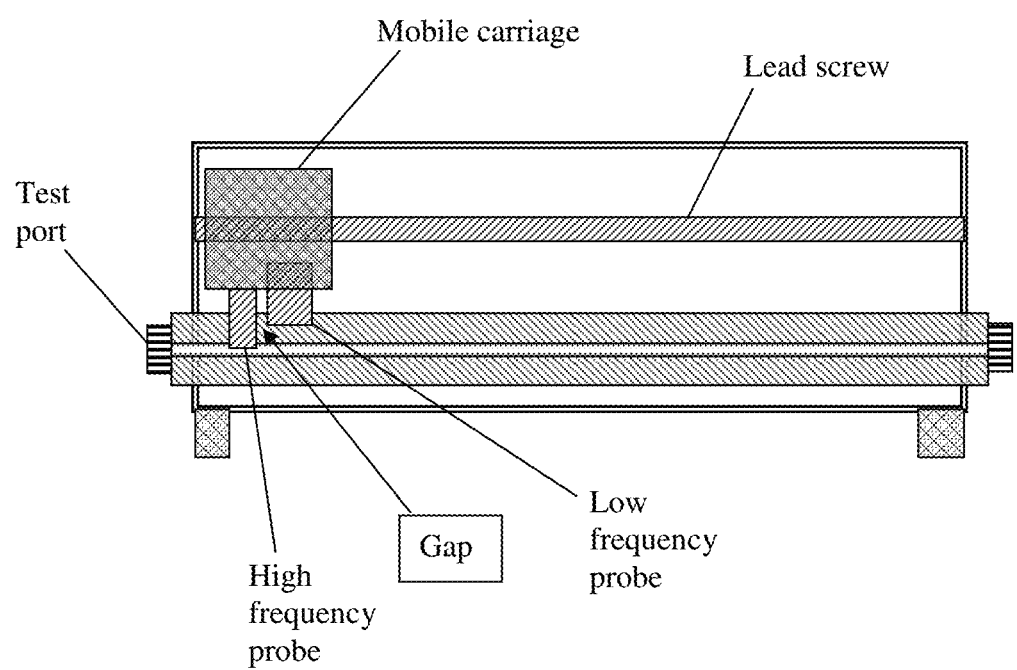
FIG. 4 depicts prior art, wideband tuner using two RF probes, one small probe for high frequencies and one large probe for low frequencies.
Figure 7:
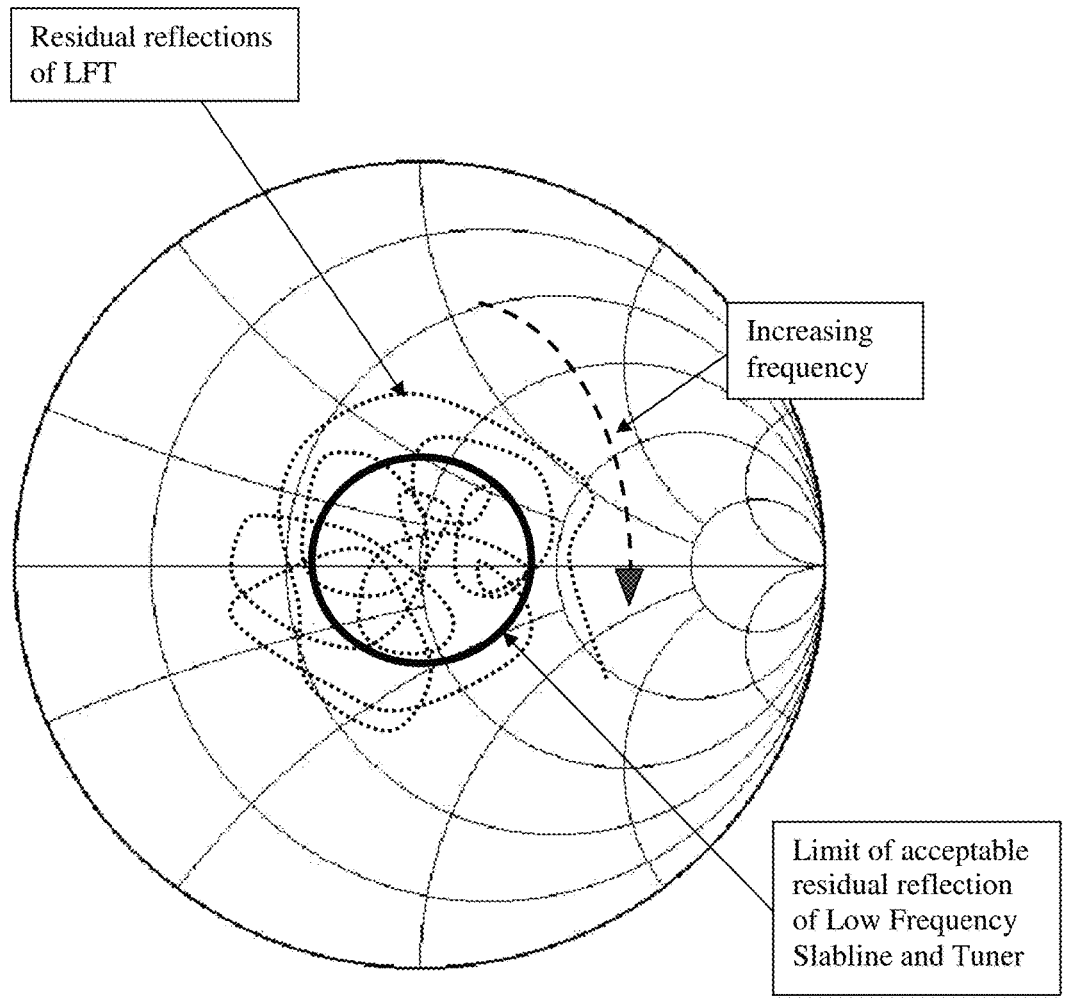
FIG. 7 depicts wideband residual reflection factor of low frequency slabline at frequencies below and above cut-off frequency.
Figure 8:
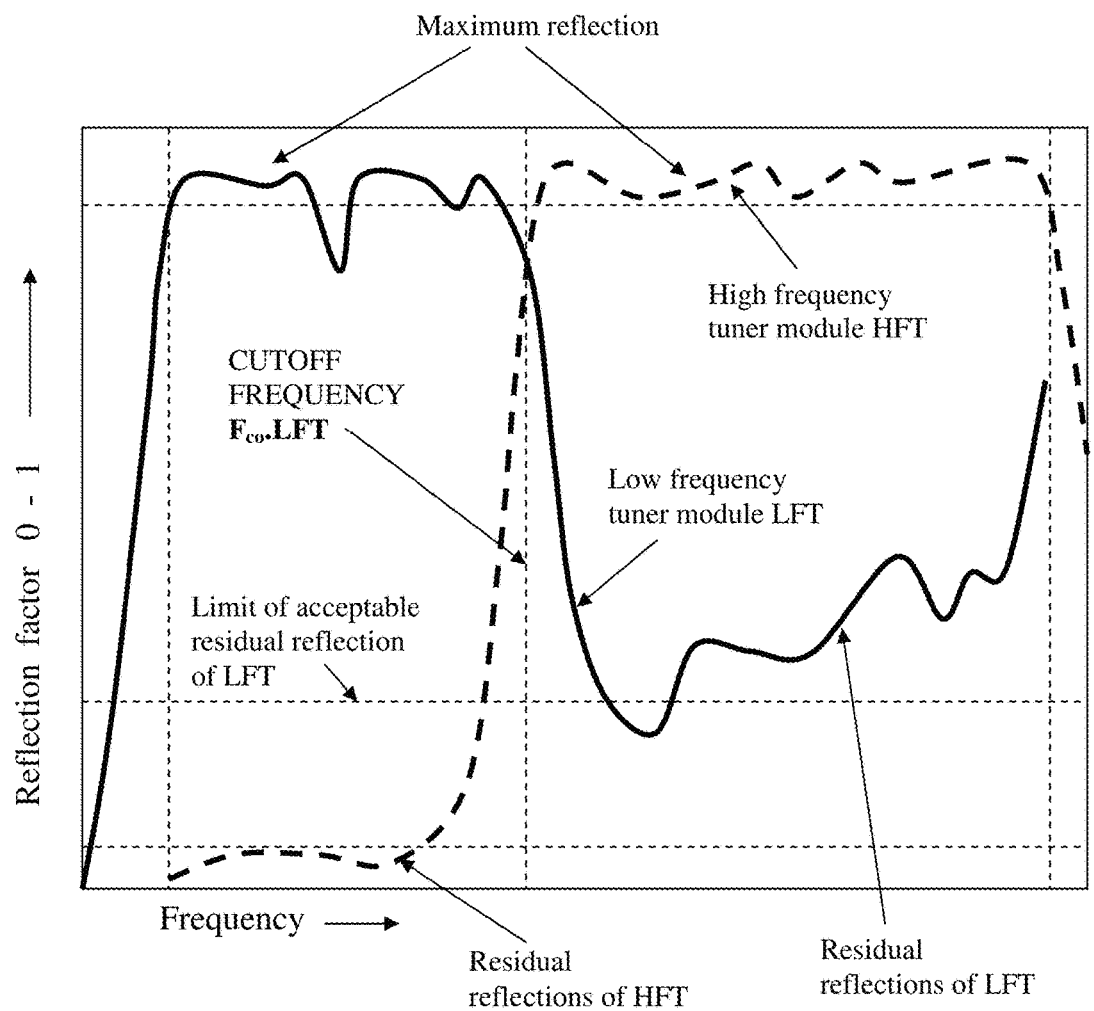
FIG. 8 depicts maximum reflection of one low frequency probe at low frequencies and residual reflection of the associated slabline at high frequencies as well as maximum reflection of a high frequency probe inside the associated slabline. The probes use slablines of different dimensions, as shown in FIGS. 6b) and 6c).

Comparing the limit frequencies in FIGS. 5b) and 8 it is important to clarify: in FIG. 5b) the cross-over frequency is the frequency at which one probe is used instead of another in the same slabline. In FIG. 8 the cut-off frequency is the limit frequency of the slabline itself, not the probe. In FIG. 5b) the reflection factor traces are measured in one slabline, in FIG. 8 the traces are measured in two different slablines with different channel widths and center conductor diameters, as shown in FIG. 6b).

Figure 11:
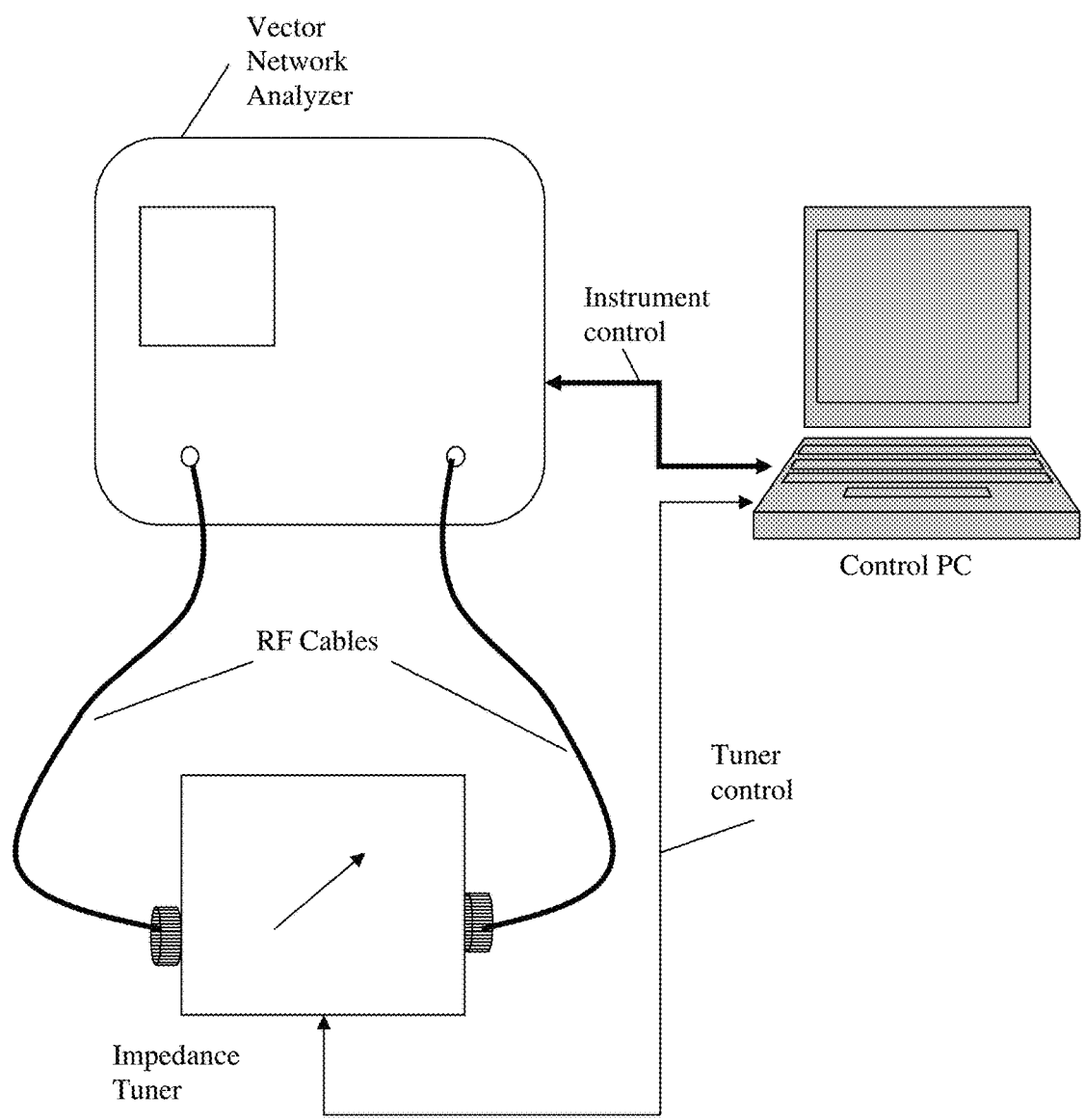
FIG. 11 depicts prior art, a setup for automatically calibrating a tuner using a vector network analyzer.

Calibrating the tuner consists in connecting it to a pre-calibrated vector network analyzer and measuring the four s-parameters as a function of the positions of each probe at the selected calibration frequency (FIG. 11). The calibration and tuning methodology at the level of each individual tuner and associated algorithms have been described before (see ref. 6); however, in this particular case the calibration algorithm must decide which probes to use and if the SPDT switch must be thrown on before starting. This can only be done previously by testing the residual and maximum reflections (tuning range) of each particular configuration and the data must be part of the algorithm. The same is valid for the tuning process, which uses calibration data. In fact, as long as those invariable parameters are entered into the calibration procedure the ultra-wideband tuner can be handled as a normal tuner for all frequencies. Switching probes and throwing SPDT switches is transparent to the user.

The present embodiments of this invention can easily be adapted to use other types of tuners as well as combinations of tuners for various frequencies in order to become ultra wideband; this shall not limit the basic idea and the overall scope of the present invention, of using cascades of different-frequency tuners in order to increase instantaneous frequency bandwidth.

I claim:

1. A large band impedance tuner having an input (test) port and an output (idle) port comprises a cascade of a high frequency tuner module (HFT) and a low frequency tuner module (LFT), and two single pole double throw (SPDT) RF switches #1 and #2,
    said RF switches being remotely controlled, each switch having a common port 1 and two secondary ports 2 and 3;
    each said tuner module having an input port and an output port and a slotted airline (slabline) between the ports and at least one capacitively coupled reflective probe being insertable in the slabline and movable along the axis of the slabline,
    whereby the slabline of the LFT has wider channel (D), higher diameter (d) of the central conductor and lower cut-off frequency (Fco) than the slabline of the HFT;
    and whereby the input port of the HFT is the input (test) port of the large band tuner, and whereby the two SPDT switches are inserted as follows:
    switch #1 is inserted between the output port of the HFT and the input port of the LFT, whereby the output port of the HFT is connected to the common port 1 of switch #1;
    switch #2 is inserted between the output port of the LFT and the output (idle) port of the large band tuner, whereby the common port 1 of switch #2 is the output (idle) port of the large band tuner.

2. A large band tuner as in claim 1,
    whereby the LFT can be either part of the large band tuner for low frequency operation, or it can be bypassed for high frequency operation;
    if the LFT is bypassed, the output port of the HFT becomes the output port of the large band tuner and the RF switches are configured as follows:
    port 1 of switch #1 is switched to port 2 of switch #1;
    port 2 of switch #1 is connected to port 2 of switch #2;
    port 1 of switch #2 is switched to port 2 of switch #2;
    if the LFT is to be part of the large band tuner, then the RF switches are re-configured as follows:
    port 1 of switch #1 is switched to port 3 of switch #1;
    port 3 of switch #1 is connected to the input port of the LFT; port 1 of switch #2 is switched to port 3 of switch #2;
    port 3 of switch #2 is connected to the output port of the LFT.

3. A large band tuner as in claim 1, whereby the LFT has two reflective RF probes, a high frequency and a low frequency probe, both probes being insertable into the slot of the slabline and remotely movable horizontally and vertically, each said probe having minimum and maximum frequency of operation;
    and whereby each probe can move horizontally at least one half of a wavelength at its minimum frequency;
    and whereby the high frequency probe is closest to the input port of the LFT.

4. A large band tuner as in claim 1, whereby the HFT has two reflective RF probes, a high frequency and a low frequency probe, both probes being insertable into the slot of the slabline and remotely movable horizontally and vertically, each said probe having minimum and maximum frequency of operation;
    and whereby the high frequency probe is closest to the input port of the HFT;
    and whereby the low frequency probe of the HFT can move horizontally at least one half of a wavelength at the cut-off frequency of the LFT.

5. An LFT as in claim 1, whereby the slabline comprises two sections, section 1 and section 2, each section having an input and an output port, section 1 being in line with the slabline of the HFT in direction of signal flow between input and output ports, and section 2 being in opposite direction than the slabline of the HFT, section 1 comprising a low frequency probe 1 and section 2 comprising a low frequency probe 2, whereby the output port of section 1 is connected to the input port of section 2 using coaxial cable or slabline "U" bend;

and whereby the sum of the horizontal travel of probes 1 and 2 covers at least 360 degrees of reflection factor at the lowest frequency of the LFT.

6. A matched low loss slotted airline (slabline) "U" bend, as in claim 5, whereby the slabline sidewalls are continuous and parallel forming a "U" shaped channel and whereby the center conductor is bent in "U" shape, matching the slabline channel, whereby the diameter of the center conductor inside the bent segment is adjusted to create a continuous characteristic impedance of the overall slabline.

7. A slabline bend as in claim 6, whereby the ratio of the diameter of the center conductor section inside the bend to the diameter of the center conductor section inside the straight slabline is approximately 0.933, when the bending angle varies between 60 and 180 degrees.

\* \* \* \* \*